US011406046B2

(12) United States Patent
Bailey et al.

(10) Patent No.: US 11,406,046 B2
(45) Date of Patent: Aug. 2, 2022

(54) DATA CENTER COOLING SYSTEM THAT PREVENTS CONDENSATION CAUSED BY OPENING EXTERNAL ACCESS DOORS

(71) Applicant: DELL PRODUCTS, L.P., Round Rock, TX (US)

(72) Inventors: Mark M. Bailey, Round Rock, TX (US); Tyler B. Duncan, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 357 days.

(21) Appl. No.: 16/740,792

(22) Filed: Jan. 13, 2020

(65) Prior Publication Data

US 2021/0219462 A1 Jul. 15, 2021

(51) Int. Cl.
*H05K 7/20* (2006.01)
*F24F 11/80* (2018.01)
*F24F 110/12* (2018.01)
*F24F 110/22* (2018.01)
*G05D 22/02* (2006.01)

(52) U.S. Cl.
CPC .......... *H05K 7/20754* (2013.01); *F24F 11/80* (2018.01); *G05D 22/02* (2013.01); *H05K 7/20745* (2013.01); *H05K 7/20836* (2013.01); *F24F 2110/12* (2018.01); *F24F 2110/22* (2018.01); *H05K 7/2079* (2013.01); *H05K 7/20827* (2013.01)

(58) Field of Classification Search
CPC ............. H05K 7/20754; H05K 7/2079; H05K 7/20827; H05K 7/20745; H05K 7/20836; F24F 11/80; F24F 2110/12; F24F 2110/22
See application file for complete search history.

(56) References Cited

U.S. PATENT DOCUMENTS

| | | | | |
|---|---|---|---|---|
| 5,651,498 A | * | 7/1997 | Meyer ............... | B01F 23/21311 165/223 |
| 6,854,284 B2 | * | 2/2005 | Bash .................. | H05K 7/20836 236/49.3 |
| 8,386,824 B2 | | 2/2013 | Artman et al. | |
| 8,583,289 B2 | * | 11/2013 | Stack ....................... | F24F 11/30 700/278 |
| 8,947,879 B2 | | 2/2015 | Broome et al. | |

(Continued)

*Primary Examiner* — Lionel Nouketcha
(74) *Attorney, Agent, or Firm* — Isidore PLLC

(57) ABSTRACT

An environmental system protects internal components of a data center from condensation due to exposure to outside air. An environmental controller of the environmental system monitors sensor(s) that detect an outside temperature value and an outside humidity value of the outside air and an interior air temperature value of the data center. The environmental controller identifies an external access request to open an access door that exposes heat-generating IT component(s) within the data center to outside air. Based on the outside and the interior air temperature values and the outside humidity value received from sensor(s), the environmental controller determines that a dew point temperature of the outside air is greater than the interior air temperature. In response, the environmental controller increases a temperature set point of the cooling system to a first temperature value that increases the interior air temperature above the dew point temperature of the outside air.

20 Claims, 13 Drawing Sheets

(56) References Cited

U.S. PATENT DOCUMENTS

| | | |
|---|---|---|
| 9,538,689 B2 | 1/2017 | Dasario et al. |
| 9,753,520 B2 | 9/2017 | Bailey et al. |
| 10,078,610 B2 | 9/2018 | Ragupathi et al. |
| 2011/0186643 A1* | 8/2011 | Dazai ........................ F24F 3/14 236/44 C |
| 2011/0316337 A1 | 12/2011 | Pelio et al. |

* cited by examiner

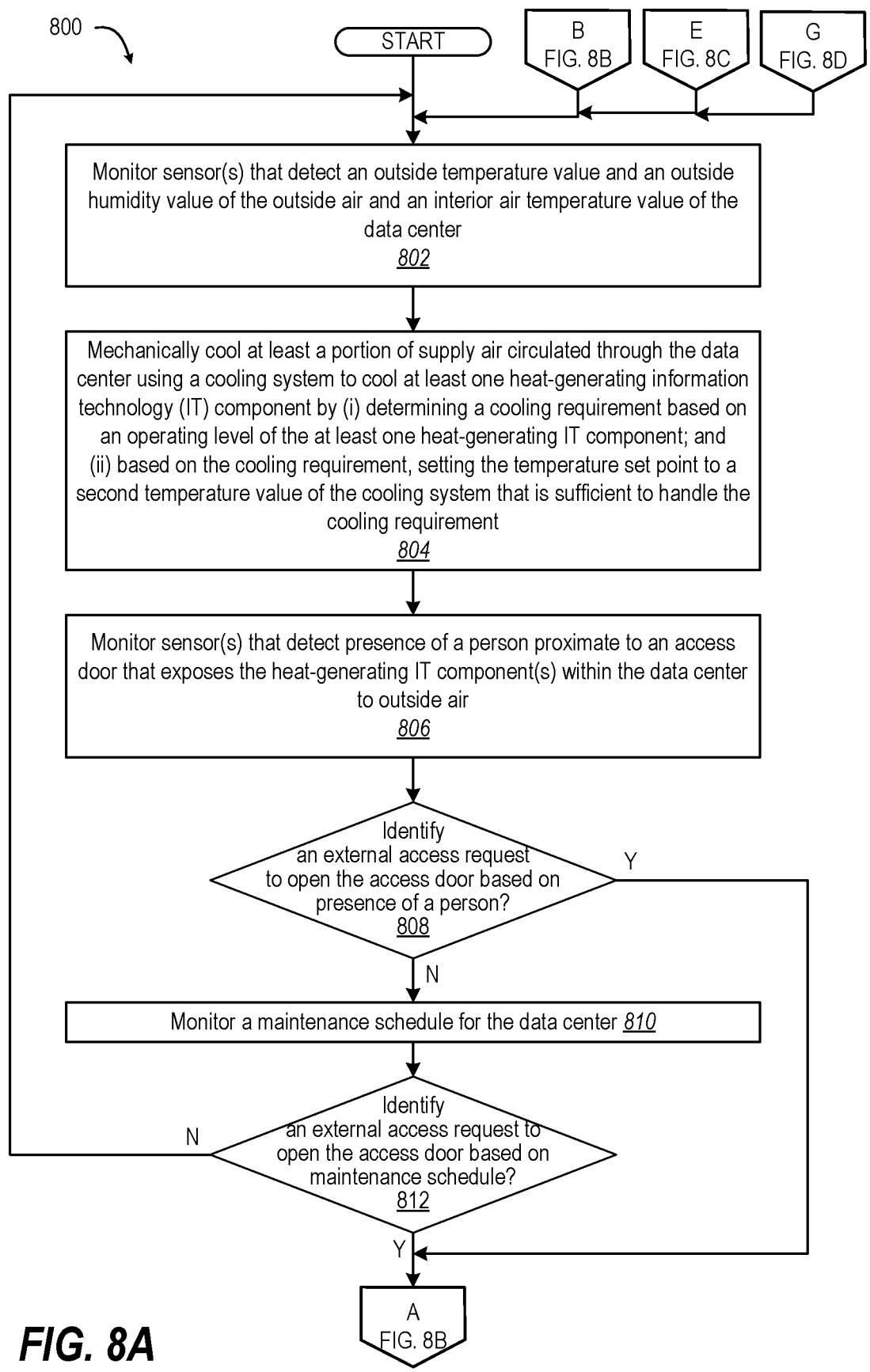

DATA CENTER COOLING SYSTEM THAT PREVENTS CONDENSATION CAUSED BY OPENING EXTERNAL ACCESS DOORS

BACKGROUND

1. Technical Field

The present disclosure generally relates to a data center with an air cooling system, and in particular to an air cooling system that controls humidity within the data center.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A data center houses information handling systems and associated components, such as telecommunications and storage systems. A modular data center (MDC) is a deployable data center. An MDC can be placed anywhere data capacity is needed. MDC systems consist of purpose-engineered modules and components that offer scalable data center capacity with multiple power and cooling options. Modular edge data centers (MEDCs) are generally smaller MDC facilities that extend the edge of the network to deliver cloud computing resources and cached streaming content to local end users. MEDCs that have only one or two racks for information technology (IT) are also referred to as micro MDCs.

Most data centers are equipped with a cooling system that includes components for mechanically cooling supply air. Condensation is a risk with any system that is mechanically cooled due to the potential of warmer moist air coming in contact with surfaces that are below the dew point of the air. This risk is increased in data centers where the separation between a cold aisle and outside air can be breached during any user/maintenance access event. The risk is particularly high with smaller MDCs whose access doors is the sole barrier between the outside air and the interior of the MDC. Opening the access door allows an interior of the MDC to be exposed to a large influx of outside air directly into an IT compartment.

BRIEF SUMMARY

Disclosed are a data center, an environmental system of a data center, and a method for protecting internal components of a data center from condensation due to exposure to outside air.

According to one embodiment, a method includes monitoring sensor(s) that detect an outside temperature value and an outside humidity value of the outside air and an interior air temperature value of the data center. The method includes identifying an external access request to open an access door that exposes heat-generating information technology (IT) component(s) within the data center to outside air. The method includes, based on the outside and the interior air temperature values and the outside humidity value received from the sensor(s), determining whether a dew point temperature of the outside air is greater than the interior air temperature. The method includes, in response to determining that the dew point temperature of the outside air is greater than the interior air temperature, increasing a temperature set point of the cooling system to a first temperature value that increases the interior air temperature above the dew point temperature of the outside air.

According to a next embodiment, an environmental system of a data center is provided that includes cooling and heating unit(s), which circulate air through the data center. The environmental system includes sensor(s) that detect an outside temperature value and an outside humidity value of the outside air and an interior temperature value of the data center. The environmental system includes a memory containing a cooling mode and external access control (CM/EAC) application. A controller that manages the environmental system is communicatively coupled to the cooling and heating unit(s), the sensor(s), and the memory. The controller executes the CM/EAC application to enable the data center cooling system to monitor sensor(s) that detect the outside temperature value and the outside humidity value of the outside air and the interior air temperature value of the data center. The controller identifies an external access request to open an access door that exposes heat-generating IT component(s) within the data center to outside air. Based on the outside and the interior air temperature values and the outside humidity value received from the sensor(s), the controller determines whether a dew point temperature of the outside air is greater than the interior air temperature. In response to determining that the dew point temperature of the outside air is greater than the interior air temperature, the controller increases a temperature set point of the cooling system to first temperature value that increases the interior air temperature above the dew point temperature of the outside air.

According to another embodiment, a data center includes heat-generating information technology (IT) component(s) positioned in a volumetric container. The data center includes an environmental system that has cooling and heating unit(s) that circulate air through the data center. The environmental system includes sensor(s) that detect an outside temperature value and an outside humidity value of the outside air and an interior temperature value of the data center. The environmental system includes a memory containing a cooling mode and external access control (CM/EAC) application. A controller of the environmental system is communicatively coupled to the cooling and heating unit(s), the sensor(s), and the memory. The controller executes the CM/EAC application to enable the data center cooling system to monitor the sensor(s). The controller identifies an external access request to open an access door that exposes heat-generating IT component(s) within the data center to outside air. Based on the outside and the interior air temperature values and the outside humidity value received from the sensor(s), the controller determines whether a dew point temperature of the outside air is greater than the interior air temperature. In response to determining that the dew point temperature of the outside air is greater than the interior air temperature, the controller increases a temperature set point of the cooling system to a first temperature value that increases the interior air temperature above the dew point temperature of the outside air.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIGS. 8A-8D (FIG. 8) depict a flow chart illustrating an example method for protecting internal components of a data center from condensation due to exposure to outside air from an opened access door, according to one or more embodiments.

DETAILED DESCRIPTION

Figure 1:
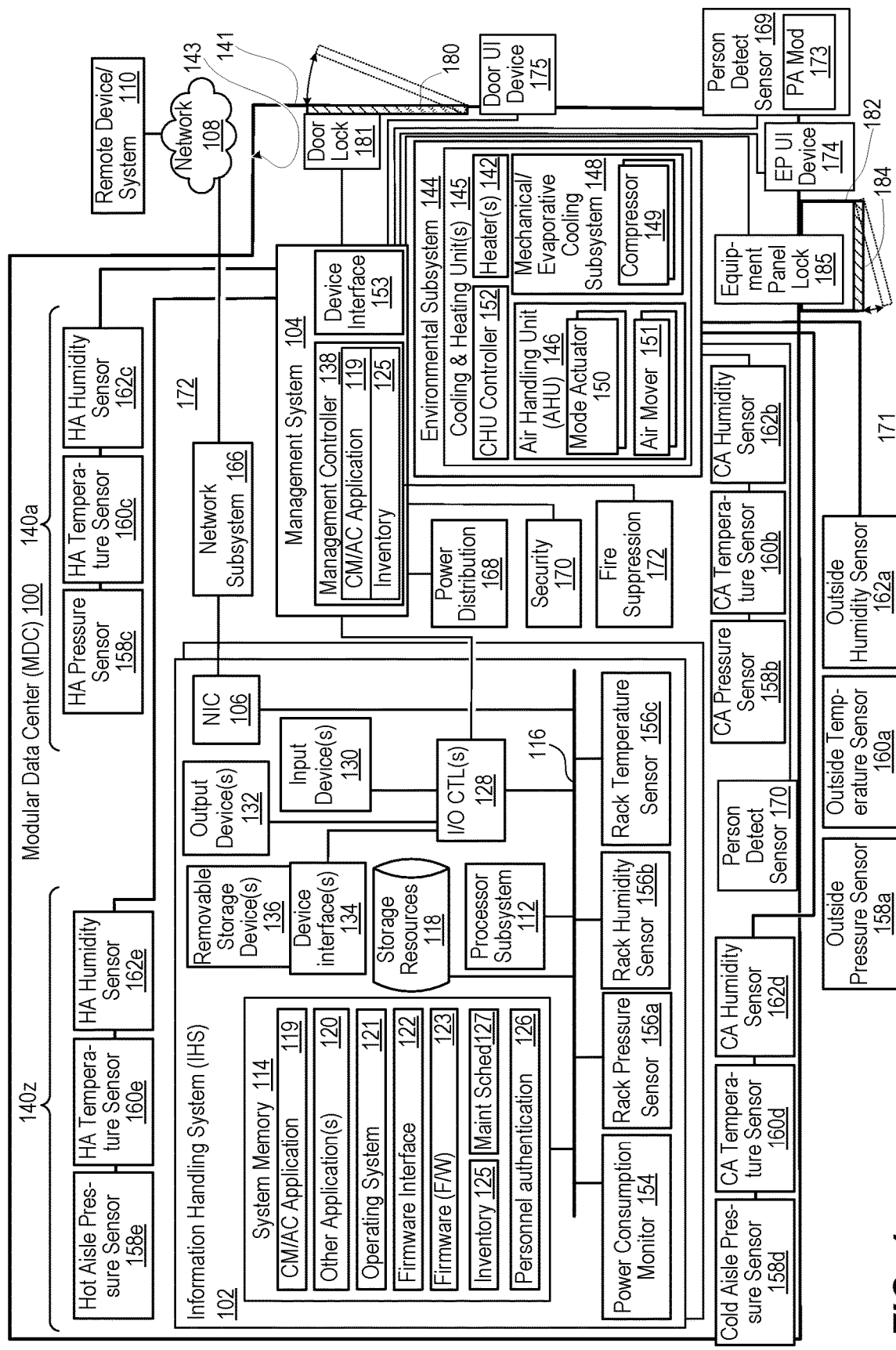
FIG. 1 depicts a simplified functional block diagram of a modular data center (MDC), according to one or more embodiments.

The illustrative embodiments provide a data center, an environmental system of a data center, and a method for protecting internal components of a data center from condensation due to exposure to outside air. An environmental controller of the environmental system monitors sensor(s) that detect an outside temperature value, an outside humidity value of the outside air, and an interior air temperature value of the data center. The environmental controller identifies an external access request to open an access door that exposes heat-generating IT component(s) within the data center to outside air. Based on the outside and the interior air temperature values and the outside humidity value received from sensor(s), the environmental controller determines whether a dew point temperature of the outside air is greater than the interior air temperature. In response to the dew point temperature of the outside air being greater than the interior air temperature, the environmental controller increases a temperature set point of the cooling system to a first temperature value that increases the interior air temperature above the dew point temperature of the outside air.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 depicts a simplified functional block diagram of a data center, and in particular a modular data center (MDC)

100 having IT components such as information handling systems (IHSs) 102 and environmental sensors used to control environmental system 104. Within the general context of IHSs, IHS 102 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, IHS 102 may be a server, blade server, rack-mounted server, rack-mounted data storage, or other rack-mounted IT equipment. IHS 102 may include random access memory (RAM), one or more processing resources such as a central processing unit (CPU) or hardware or software control logic, read only memory (ROM), and/or other types of nonvolatile memory. Additional components of the IHS 102 may include one or more disk drives, one or more network ports for communicating with external devices as well as various input and output (I/O) devices, such as a keyboard, a mouse, and a video display. The IHS 102 may also include one or more buses operable to transmit communications between the various hardware components. In one or more embodiments, IHS 102 is rack-mounted to provide computing, communication and storage functionality in mobile MDC 100.

IHS 102 includes a network interface, depicted as network interface controller (NIC) 106. NIC 106 enables IHS 102 and/or components within IHS 102 to communicate and/or interface with other devices, services, and components that are located external to IHS 102. In one embodiment, NIC 106 enables IHS 102 to be in communication with and receive IHS updates and work requests from remote device systems 110, via network 108. These devices, services, and components can interface with IHS 102 via an external network, such as network 108, using one or more communication protocols that include transport control protocol (TCP/IP) and network block device (NBD) protocol. Network 108 can be a local area network, wide area network, personal area network, and the like, and the connection to and/or between network 108 and IHS 102 can be wired, wireless, or a combination thereof. For ease of description, network 108 is indicated as a single collective component for simplicity. However, it should be appreciated that network 108 can comprise one or more direct connections to other devices as well as a more complex set of interconnections as can exist within a local area network or a wide area network, such as the Internet.

A processor subsystem 112 is coupled to system memory 114 via system interconnect 116. System interconnect 116 can be interchangeably referred to as a system bus, in one or more embodiments. System interconnect 116 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. For the purpose of this disclosure, system interconnect 116 can also be a Double Data Rate (DDR) memory interface. The system memory 114 can either be contained on separate, removable dual inline memory module (RDIMM) devices or system memory 114 can be contained within persistent memory devices (NVDIMMs). For example, the NVDIMM-N variety of NVDIMMs contain both random access memory, which can serve as system memory 114, and non-volatile memory. It should be noted that other channels of communication can be contained within system interconnect 116, including but not limited to inter-integrated circuit (i2c) or system management bus (SMBus). System interconnect 116 communicatively couples various system components. Examples of system components include replaceable local storage resources 118 such as solid state drives (SDDs) and hard disk drives (HDDs). Software and/or firmware modules and one or more sets of data that can be stored on local storage resources 118 and be utilized during operations of IHS 102. Specifically, in one embodiment, system memory 114 can include therein a plurality of such modules, including cooling mode/external access control (CM/EAC) application 119, other application(s) 120, operating system (OS) 121, a firmware interface 122 such as basic input/output system (BIOS) or Uniform Extensible Firmware Interface (UEFI), and platform firmware (FW) 123. These software and/or firmware modules have varying functionality when their corresponding program code is executed by processor subsystem 112 or secondary processing devices within IHS 102. For example, other application(s) 120 may include a word processing application and a presentation application, among other applications. System memory 114 can include computer data structures and data values for use by applications 119, 120 such as inventory 125, personnel authentication information 126, and maintenance schedule (Maint Sched) 127.

IHS 102 further includes one or more input/output (I/O) controllers 128 that support connection by and processing of signals from one or more connected input device/s 130, such as a keyboard, mouse, touch screen, or microphone. I/O controllers 128 also support connection to and forwarding of output signals to one or more connected output devices 132, such as a monitor or display device or audio speaker(s). Additionally, in one or more embodiments, one or more device interfaces 134, such as an optical reader, a universal serial bus (USB), a card reader, Personal Computer Memory Card International Association (PCMCIA) slot, and/or a high-definition multimedia interface (HDMI), can be associated with IHS 102. Device interface(s) 134 can be utilized to enable data to be read from or stored to corresponding removable storage device/s 136, such as a compact disk (CD), digital video disk (DVD), flash drive, or flash memory card. In one or more embodiments, device interface(s) 134 can further include general purpose I/O interfaces such as inter-integrated circuit (I$^2$C), system management bus (SMB), and peripheral component interconnect (PCI) buses.

In one or more embodiments, enclosure structure 141 is provided by volumetric container 143. In one or more alternate embodiments, enclosure structure is a building that houses a data center. Management system 104, managed by management controller 138, provides, via environmental subsystem 144, cooling air to meet the cooling requirements of IHSs 102 in one or more zones 140a, 140z defined within enclosure structure 141 of MDC 100. The cooling requirements can include specified temperature and humidity ranges for startup, standby, and operation of IHSs 102. Operating outside of these ranges can degrade the service life or prevent effective operation of IHSs 102. Environmental subsystem 144 can be composed of one or more stand-alone cooling and heating units 145 that include heater(s) 142, air handling unit(s) 146 and evaporative/mechanical cooling subsystems 148. Compressor(s) 149 in evaporative/mechanical cooling subsystems 148 provide heat transfer for environmental subsystem 144. Air handling unit(s) 146 have mode actuators 150 that configure air flow for closed loop recirculation, open loop venting with cooling by outside air, or a mixed mode with a partial recirculation of air. The air is moved by air mover(s) 151 of air handling unit(s) 146. Management controller 138 can include some or all of the components and functionality described above for IHSs 102. In one or more embodiments, management controller 138 acts as supervisory controller to respective control unit controllers 152 that control corresponding cooling and heating unit(s) 145. In one or more embodiments, management controller 138 executes CM/EAC application 119 to enable environmental system 104 of MDC 100 to provide the functionality described herein. In one or more embodiments, IHSs 102 can communicate cooling requirements to management controller 138 via device interface 153, based on values provided by power consumption monitor 154, rack pressure sensor 156a, rack humidity sensor 156b, and rack temperature sensor 156c. For example, the cooling requirement can indicate a temperature set point and a current internal temperature. As another example, the cooling requirement can indicate a current heat load being produced by IHSs 102. In one or more embodiments, management controller 138 can determine cooling requirements based in part on outside environmental sensors, depicted as outside pressure sensor 158a, outside temperature sensor 160a, and outside humidity sensor 162a. In one or more embodiments, management controller 138 can determine cooling requirements for first zone 140a based in part on cold aisle (CA) environmental sensors in first zone 140a, depicted as CA pressure sensor 158b, CA temperature sensor 160b, and CA humidity sensor 162b. In one or more embodiments, management controller 138 can determine cooling requirements for first zone 140a based in part on hot aisle (HA) environmental sensors in first zone 140a, depicted as HA pressure sensor 158c, HA temperature sensor 160c, and HA humidity sensor 162c.

In one or more embodiments, management controller 138 can determine cooling requirements for second zone 140z based in part on CA environmental sensors in second zone 140z, depicted as CA pressure sensor 158d, CA temperature sensor 160d, and CA humidity sensor 162d. In one or more embodiments, management controller 138 can determine cooling requirements for second zone 140z based in part on HA environmental sensors in second zone 140z, depicted as HA pressure sensor 158e, HA temperature sensor 160e, and HA humidity sensor 162e.

One or more person detect (PD) sensors 169, 170 detect a presence of a person in at least one of: (i) proximity to exterior 171 of volumetric container 143; and (ii) interior 172 of volumetric container 143. PD sensor 169 generally represents sensors located external to volumetric container 143, while PD sensor 170 generally represents sensors located internal to volumetric container 143. PD sensors 169, 170 can be any one or more of a host of sensors including one or more of: (i) infrared sensor; (ii) optical sensor; (iii) range finding sensor; (iv) acoustic sensor; (v) pressure sensor; (vi) light curtain sensor; (vii) motion sensor; and (viii) door sensor. Accordingly, PD sensors 169, 170 can provide respective functions including one or more of (i) infrared imaging; (ii) optical imaging; (iii) range finding; (iv) acoustic sensing; (v) pressure sensing; (vi) light curtain sensing; (vii) motion sensing; and (viii) door sensing. Personnel authentication module (PA Mod) 173 receives authentication credentials to verify authorized personnel using personnel authentication information 126 to gain access to the interior 172 of MDC 100. Personnel authentication module 173 can be incorporated in sensor(s) 169, 170, and thus provide a corresponding authentication, such as performing facial recognition on an image that is also used to detect the presence of a person. Personnel authentication module 173 can be a separate module executed by management controller 138. Personnel authentication module 173 can receive credentials from user interface (UI) devices, depicted as equipment panel UI device 174 and door UI device 175. Personnel authentication module 173 can support one or more authentication capabilities including: (i) biometric voice recognition; (ii) biometric facial recognition; (iii) biometric fingerprint recognition; (iv) biometric retina recognition; (v) manual, gesture or oral passcode verification; (vi) access card reading; and (vii) radio frequency identification (RFID) badge interrogation.

According to aspects of the present disclosure, heat-generating IT components contained within interior 172 of volumetric container 143 are accessible via personnel access door 180. Electrically actuated personnel door lock 181 locks and unlocks personnel access door 180. Heat-generating IT components contained within equipment panel 182 attached to an exterior surface of volumetric container 143 are accessible via equipment panel access door 184. Electrically actuated equipment panel door lock 185 locks and unlocks equipment panel access door 184. Management controller 138 executes CM/EAC application 119 to control equipment panel UI device 174, door UI device 175, personnel door lock 181, and equipment panel door lock 185.

In one or more embodiments, management system 104 controls infrastructure support to IHSs 102 in MDC 100, including control of environmental subsystem 144, network subsystem 166, power distribution subsystem 168, security subsystem 170, and fire suppression subsystem 172. Management system 104 can be assigned to control these functions within a particular volumetric container 143. In one or more embodiments, management system 104 is assigned to control these functions within an IT space within one or more rooms of a facility. In one or more embodiments, management system 104 is part of IHS 102. In one or more embodiments, management system 104 is part of environmental subsystem 144. In one or more embodiments, management system 104 is at least partially provided by remote device system 110. In one or more embodiments, management controller 138 is a programmable logic controller (PLC) that is connected to the other subsystems via one or more interconnects and communication protocols. Management controller 138 interfaces with IHSs 102, the infrastructure subsystems (144, 166, 168, 170, and 172), and communicates to a network operations center or building management system. According to the present disclosure, management controller 138 executes CM/EOS application 119 to enable management system 104 to provide the functionality associated with the various aspects of the present disclosure.

Figure 2:
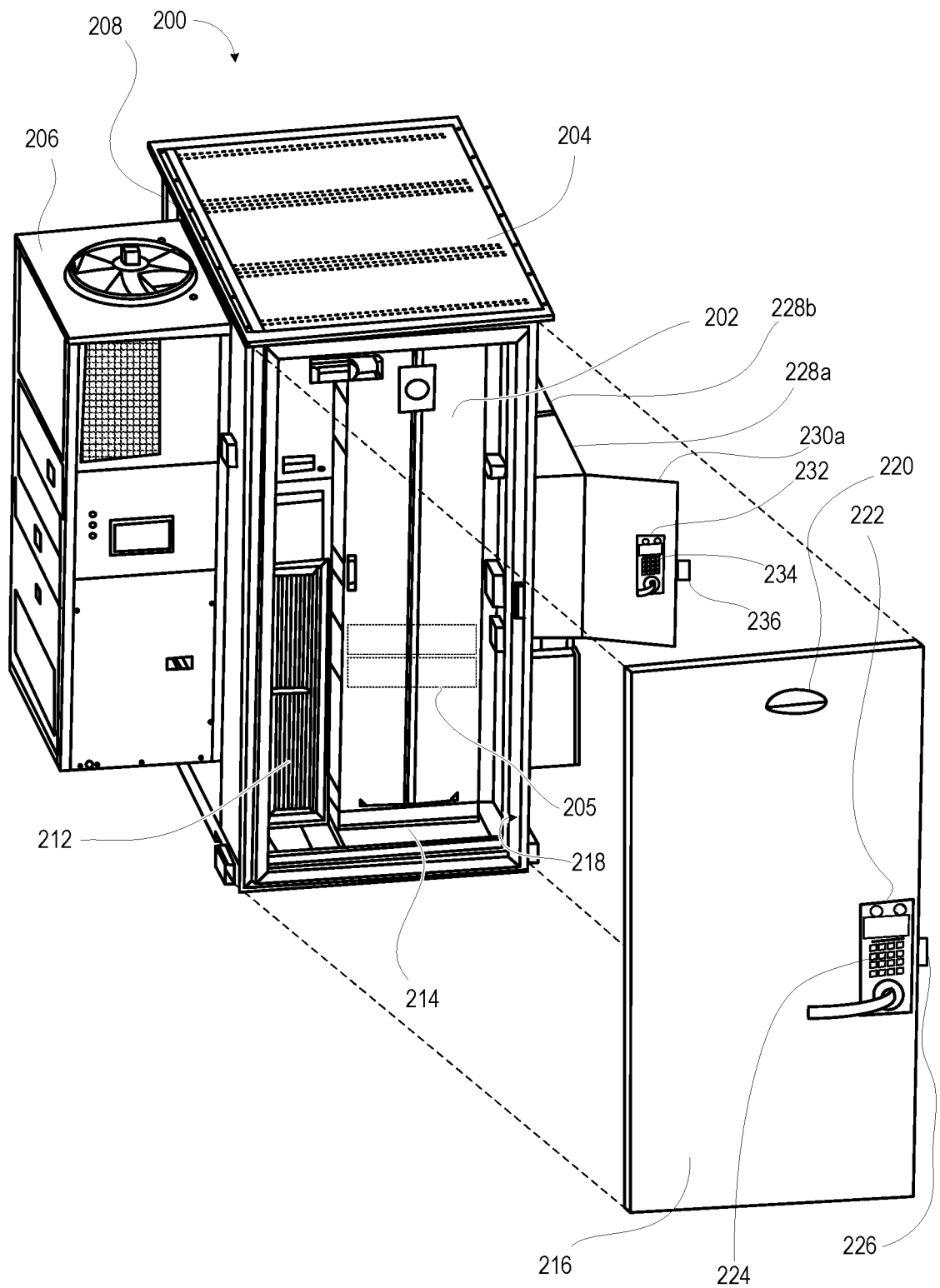
FIG. 2 depicts a perspective top left view of an example MDC, according to one or more embodiments.

FIG. 2 depicts a perspective, top left view of example modular data center (MDC) 200. MDC 200 can be placed in locations where data capacity is needed. MDC 200 is an example three-dimensional (3D) implementation of MDC 100 (FIG. 1). MDC 200 is composed of purpose-engineered modules and components that offer scalable data center capacity with multiple power and cooling options. Minimizing a footprint of an MEDC, and especially for a micro MDC, enables use in space-constrained applications. Rack Information Handling System (RIHS) 202 is positioned within volumetric container 204. RIHS 202 contains heat-generating IT components 205 such as IHSs 102 (FIG. 1). Cooling and heating unit 206 is mounted to rear external wall 208 and directs air internally through volumetric container 204 via air redirection structure 212. Supply air is directed to cold aisle 214 to cool RIHS 202.

Left personnel access door 216 is depicted as removed from volumetric container 204 only for purposes of illustrating components enclosed within volumetric container 204. It is understood that left personnel access door 216 is not removed from volumetric container 204, and is attached to left door opening 218 in order to close volumetric container 204. When closed in left door opening 218, left personnel access door prevents outside air from entering cold aisle 214. Person detection sensor 220 is mounted on left access door 216 to detect a person proximate to left access door 216. Left door control assembly 222 includes door UI device 224 and personnel door lock 226. Equipment panel 228a is attached to a front side of volumetric container 204. Equipment panel access door 230a includes door control assembly 232, which includes door UI device 234 and personnel door lock 236. Second equipment panel 228b is beside equipment panel 228a.

Figure 3:
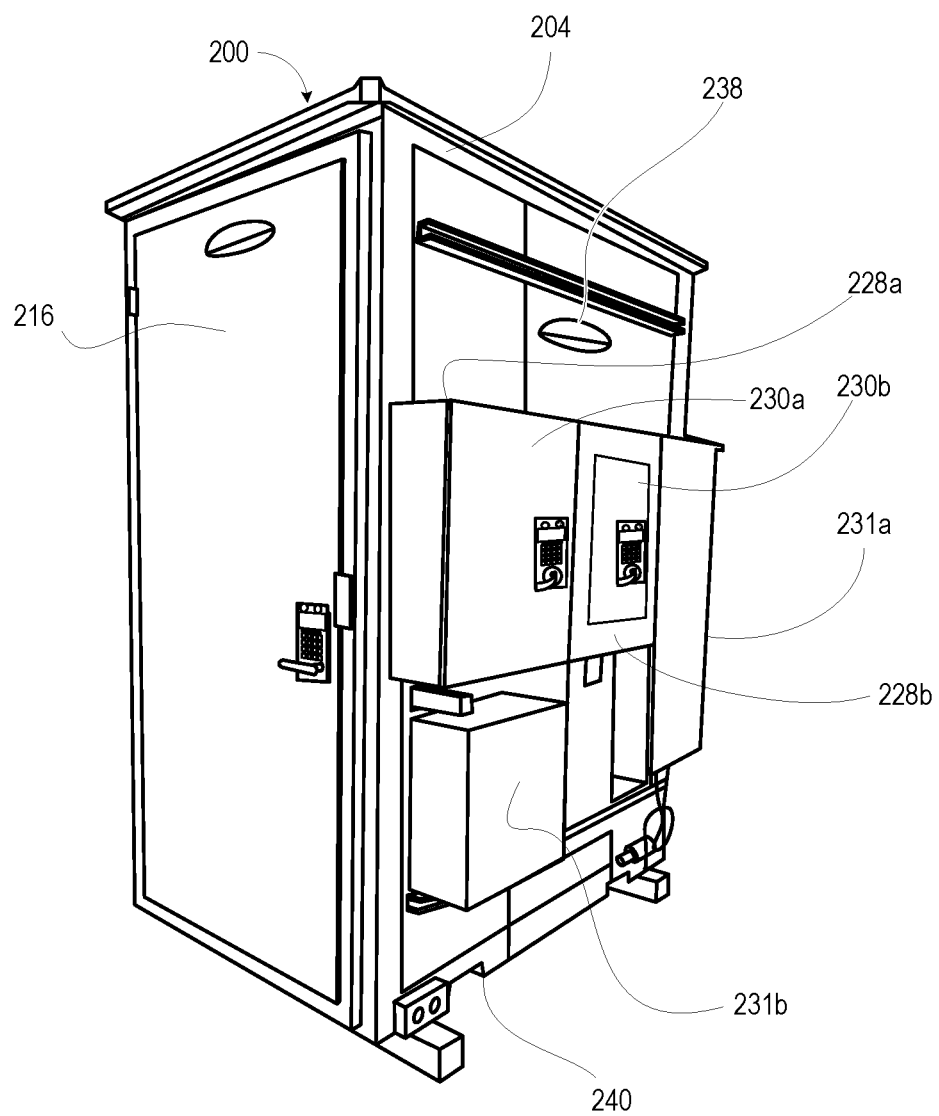
FIG. 3 depicts a perspective left front view of the example MDC of FIG. 2, according to one or more embodiments.

FIG. 3 depicts a perspective left front view of example MDC 200. Left personnel access door 216 is depicted in a closed position. Equipment panel access doors 230a-230b of equipment panels 228a-228b are also depicted in a closed position. Person detection sensor 238 is mounted on the front side of volumetric container 204 to detect a person proximate to equipment panel access doors 230a-230b. Equipment panels 231a-231b are not vulnerable to condensation and do not include automated locking features. Base 240 of volumetric container 204 includes pallet-like features for movement of MDC 200 by forklift vehicle.

Figure 4:
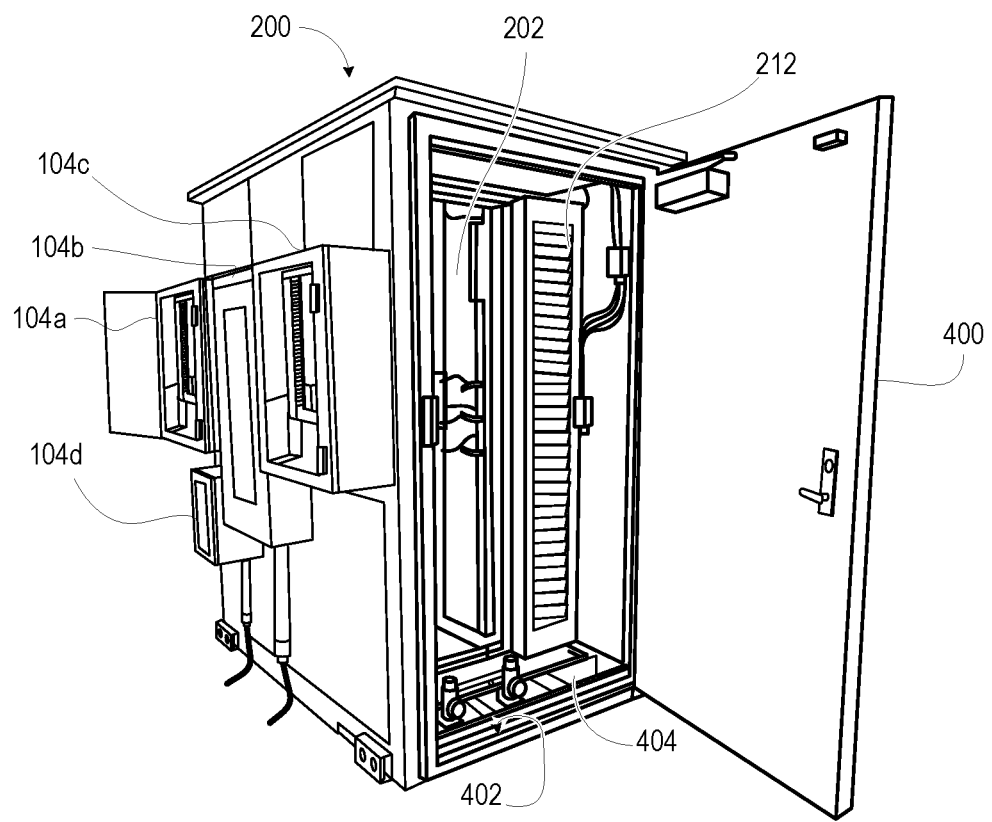
FIG. 4 depicts a perspective right front view of the example MDC of FIG. 2, according to one or more embodiments.

FIG. 4 depicts a perspective right front view of example MDC 200 with right personnel access door 400 open. When right personnel access door 400 is closed in right door opening 402, air redirection structure 212 draws return air from hot aisle 404 back to cooling and heating unit 206 (FIG. 2). Aspects of the present disclosure for monitoring and controlling right personnel access door 400 can be the same as used for left personnel access door 216.

Figure 5:
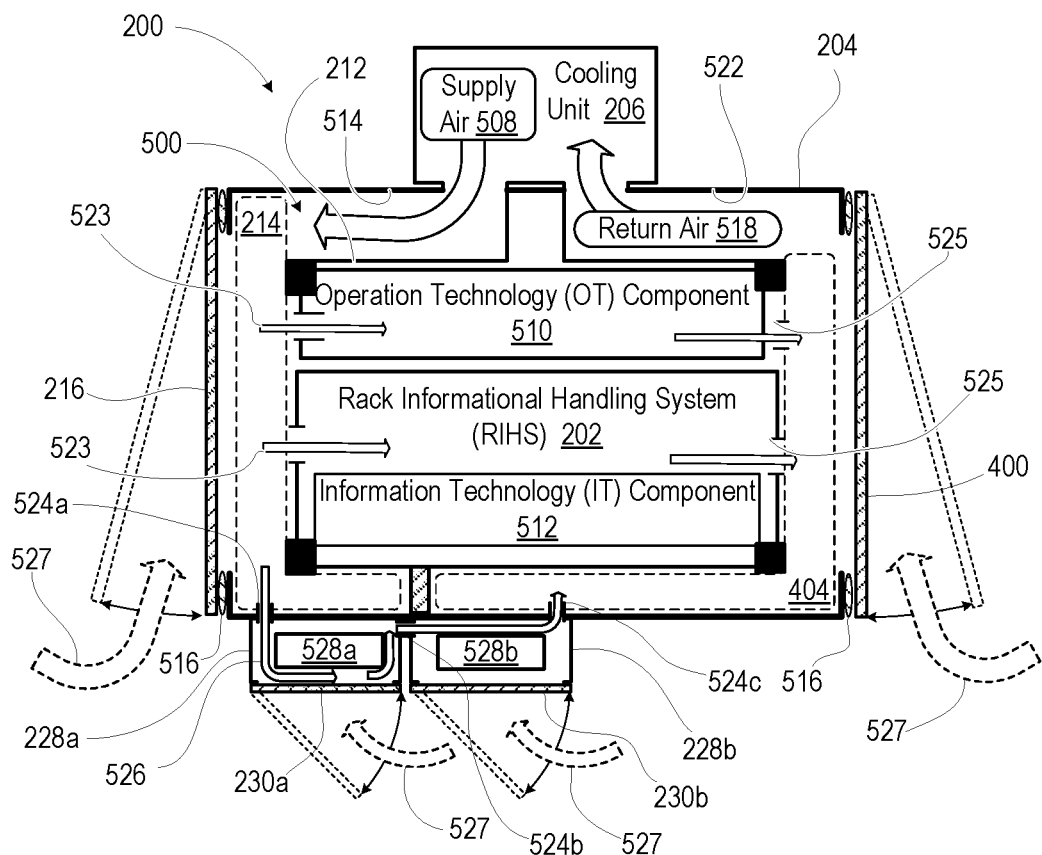
FIG. 5 depicts a top diagrammatic view of air flow patterns in the example MDC, according to one or more embodiments.

FIG. 5 depicts a top diagrammatic view of air flow patterns 500 in example MDC 200 with left and right access doors 216, 400 in a closed position. Cooling and heating unit 206, which is exteriorly coupled to volumetric container 204, provides supply air 508. Cooling and heating unit 206 can prepare supply air 508, which can include recirculated air, outside air, or mixed air. Cooling and heating unit 206 warms, cools, dehumidifies, or humidifies the air, as required for operation technology (OT) components 510 and information technology (IT) components 512 in RIHS 202. For example, cooling and heating unit 206 can cool air using direct evaporative cooling or mechanical cooling. Supply air plenum 514 of air redirection structure 212 directs pressurized supply air 508 to cold aisle 214. During normal operation, left and right access doors 216, 400 are sealed with door seals 516 to prevent loss of cooling air. Cooling and heating unit 206 draws return air 518 from hot aisle 404 via return air plenum 522 of air redirection structure 212. Cooling and heating unit 206 creates a lower pressure within hot aisle 404 than cold aisle 214. As a result of the pressure differential, cooling air 523 is passively drawn through inlet/outlet air passages 525 in OT components 510 and RIHS 202.

Supply air 508 can be colder than the dew point temperature of outside air 527, which can result in condensation on OT and IT components 510, 512 if the warmer outside air 527 is allowed to enter through either of left and right access doors 216, 400. Aspects of the present disclosure avoid or mitigate the occurrence of condensation when access from the outside is made through either left or right access doors 216, 400, exposing the inside of the container to outside air.

Cooling and heating unit 206 provides supply air that also air cools equipment panel 228a-228b. Pneumatic passages 524a-524c respectively provide fluid communication of supply air 526 between: (i) cold aisle 214 to equipment panel 230a; (ii) equipment panel 228a to equipment panel 228b; and (iii) equipment panel 228b to hot aisle 404. Supply air 526 within equipment panels 228a-228b can be colder than the dew point temperature of outside air 527, which can result in condensation on IT components 528a-528b if the outside air is allowed to enter through either of equipment panel access doors 230a-230b. Aspects of the present disclosure avoid or mitigate occurrence of condensation when access is made through either equipment panel access doors 230a-230b.

Figure 6:
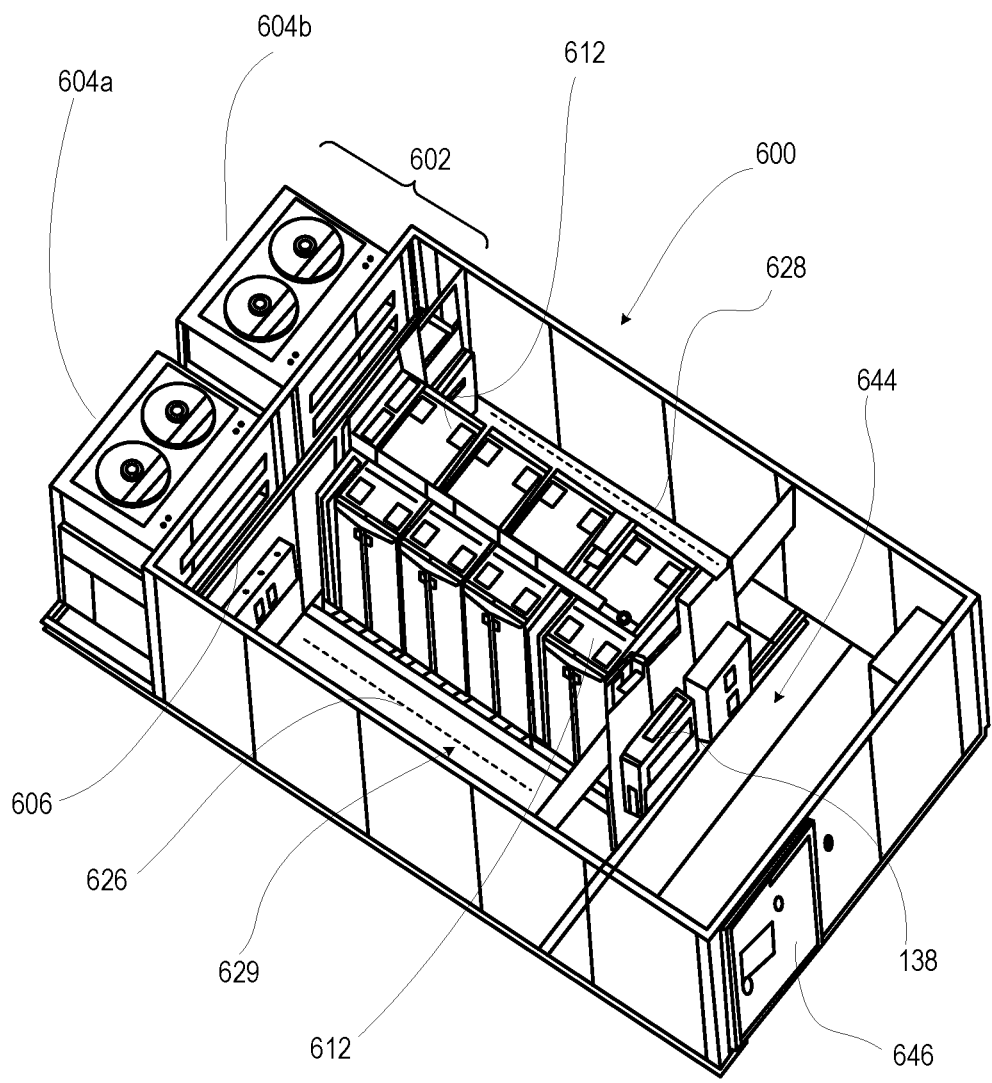
FIG. 6 depicts a three-dimensional, top view of an example MDC that has an information technology (IT) compartment and a utility room, according to one or more embodiments.

FIG. 6 depicts a three-dimensional, top view of example MDC 600 that has IT compartment 629 and utility room 644. IT compartment 629 includes a longitudinal row of IT components 612 between cold and hot aisles 626, 628. Dual-AHU air handling system 602 of MDC 600 includes two forward-mounted or aft-mounted AHUs 604a, 604b. AHUs 604a, 604b exchange cooling air with IT compartment 629 and utility room 644 via air redirection structure 606 and cold and hot aisles 626, 628. Utility room 644 includes management controller 138 that monitors and controls access door 646 to utility room 644. MDC 600 is presented as an example MDC. However, it is appreciated that aspects of the present disclosure can be applied to data centers housed in institutional buildings, larger MDCs within a single volumetric container, smaller MDCs (e.g., micro-MDCs) having one or two racks within a small volumetric container, and MDCs that include multiple volumetric enclosures.

Figure 7:
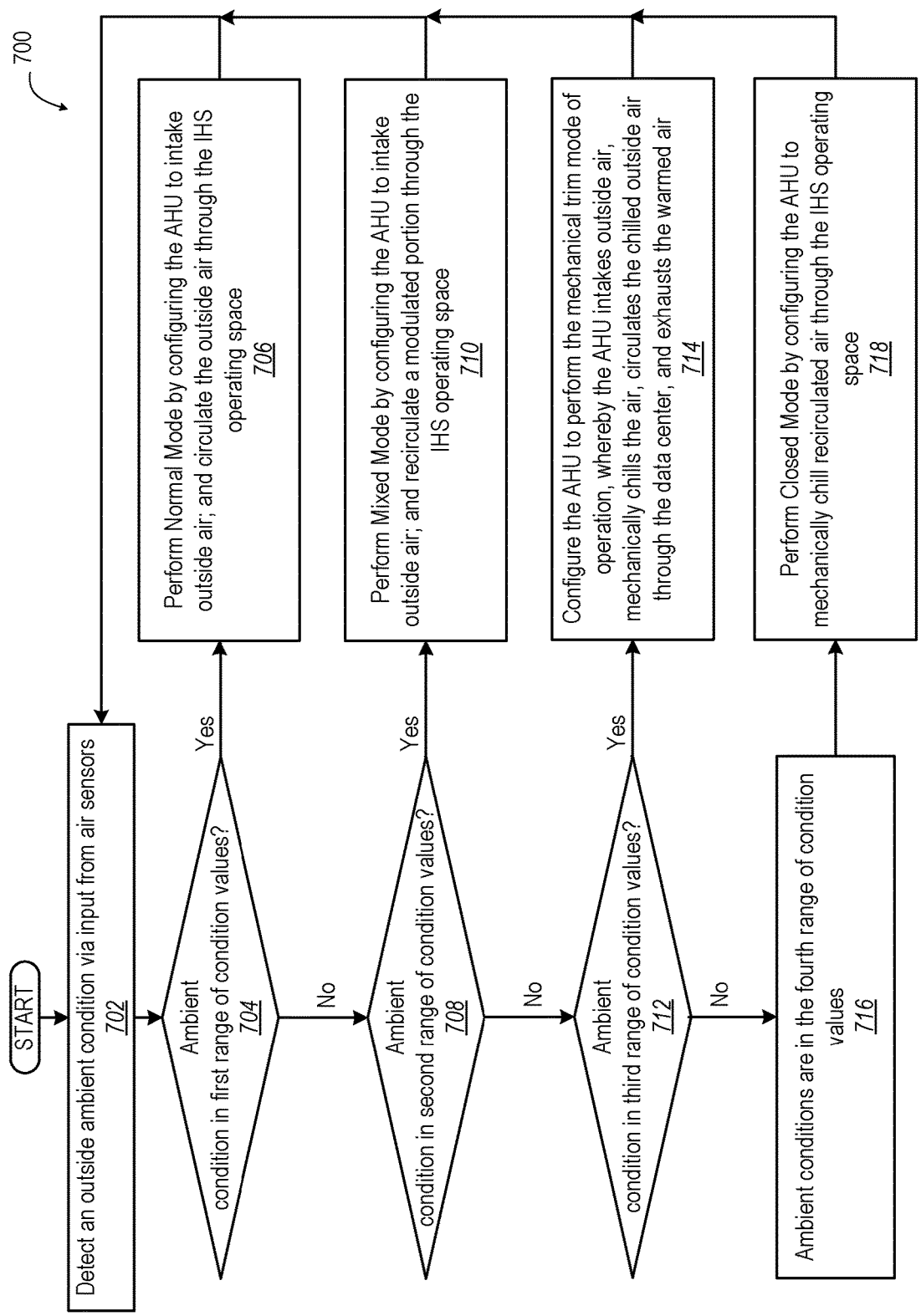
FIG. 7 presents a flow chart of an example method for controlling a multiple mode cooling system of a data center, according to one or more embodiments.

FIG. 7 depicts a method 700 for cooling IT components using one of multiple modes within a data center that has a cooling system. The data center can be one of MDC 100 (FIG. 1), 200 (FIG. 2), and 600 (FIG. 6) or another configuration of a data center. The description of method 700 is provided with general reference to the specific components illustrated within the preceding FIGS. 1-6. In at least one embodiment, method 700 can be implemented using management controller 138 (FIG. 1) that operates environmental subsystem 144 (FIG. 1). In one embodiment, method 700 includes detecting, via input from air sensors, an outside ambient condition as being in one of four ranges (block 702). In one embodiment, the four ranges are mutually exclusive and cover the full range of environmental conditions that the MDC encounters at the operational location. Each range is associated with a corresponding mode of operation of the cooling subsystem. First, a "normal mode" provides open loop cooling using outside air. Second, a "mixed mode" provides mixing outside air with recirculated return air that is warmed by the data center. Third, a "mechanical trim mode" includes mixing of outside air with recirculated return air. Fourth, a "closed mode" recirculates all return air with cooling provided by the mechanical cooling subsystem. In one or more embodiments, fewer modes may be required for a particular location, enabling omission of certain environmental components. For clarity, other environmental considerations, such as a presence of contaminants in the outside air, that can affect mode selection are not depicted. The ranges are based at least on outside air temperature and outside air humidity. In one or more embodiments, the four ranges are defined on a psychrometric chart that is tailored for the location of the data center.

Method 700 includes determining (decision block 704) whether the outside ambient condition is within a first range of condition values associated with the "normal mode" of operation. In response to determining in decision block 704 that the outside ambient condition falls within the first range of condition values, method 700 includes configuring the AHU 146 (FIG. 1) to perform normal mode (or open loop) cooling. The AHU 146 intakes outside air, circulates the outside air through the data center operating space, and exhausts the warmed air out of the data center (block 706). The AHU is configured by actuating dampers, louvers, or other mechanisms to direct air. Then, method 700 returns to block 702 to monitor the outside ambient condition.

In response to determining, at decision block 704, that the outside ambient condition did not fall within the first range of condition values, method 700 includes determining whether the outside ambient condition is within a second range of condition values (decision block 708). The second range corresponds to certain temperatures of outside air that are too cold and/or humidity values of outside air that are too high for direct use. In the second range, the outside air can be made acceptable in combination with a selected amount of recirculated return air that has been warmed within the data center. In response to determining, in decision block 708, that the outside ambient condition is within the second range of condition values, method 700 includes configuring the AHU to perform mixed mode cooling. The AHU intakes outside air, circulates the outside air through the data center along with a mix of recirculated, warmed air of a modulated amount (e.g., 7-97%), and exhausts the remainder of the warmed air (block 710). The range of return air that is recirculated can be varied between 0-100% with the remainder of the return air being exhausted. From block 710, method 700 returns to block 702 as the sensors continually monitor the outside ambient condition.

In response to determining in decision block 708 that the outside ambient condition did not fall within the second range of condition values, method 700 includes determining whether the outside ambient condition is within a third range of condition values (decision block 712). The third range corresponds to certain outside temperatures that are too hot and/or humidity values that are too high for direct use. In the third range, the outside air can be made acceptable by mechanical cooling. In response to determining in decision block 712 that the outside ambient condition is within the third range of condition values, method 700 includes configuring the AHU to perform the mechanical trim mode of operation. The AHU intakes outside air, mechanically chills the air, circulates the chilled outside air through the data center, and exhausts the warmed air (block 714). Then, method 700 returns to block 702 to monitor the outside ambient condition. Compressor(s) of the mechanical cooling subsystem are used to directly or indirectly air condition at least a portion of the air routed through a heat exchanger. In one or more embodiments, a chiller system is interposed between the heat exchanger and the compressor(s) of the air conditioning system. Liquid in the chiller system, such as water, is cooled by activating the compressor(s). The chilled water is circulated through the heat exchanger to cool the air.

In response to determining in decision block 712 that the outside ambient condition did not fall within the third range of condition values, method 700 includes determining that the outside ambient condition is within a fourth range of condition values (block 716). The fourth range corresponds to certain combinations of outside temperatures that are too hot and/or humidity values that are too high for mechanical trim mode. The fourth range requires closed loop mechanical cooling. Method 700 includes configuring the AHU to perform closed mode operation by wholly recirculating air through the data center while mechanically chilling the air (block 718). Then, method 700 returns to block 702 to monitor the outside ambient condition. Closed loop cooling uses the mechanical cooling of the recirculated air.

Figure 8B:
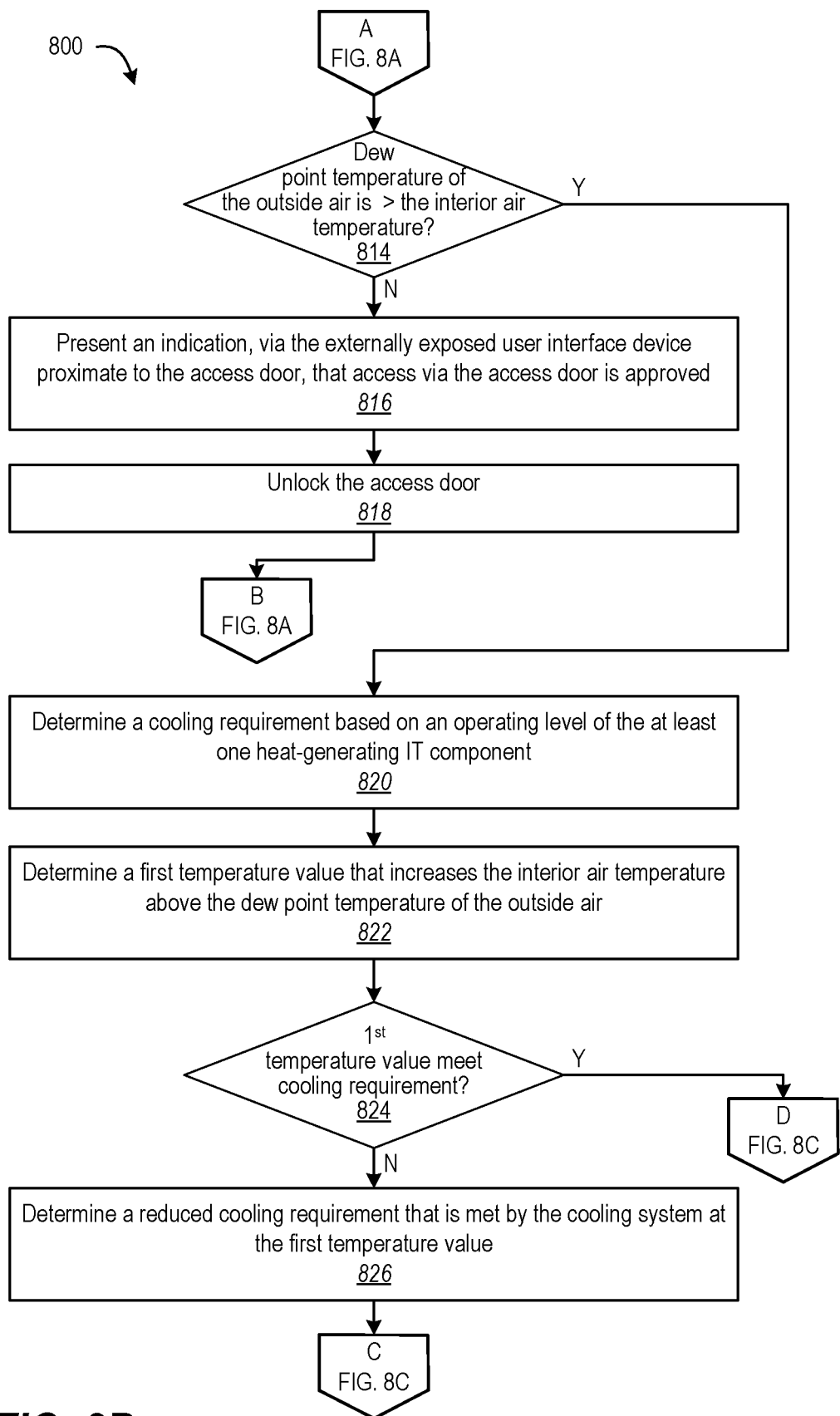

FIGS. 8A-8D (FIG. 8) depict a method 800 for protecting internal components of a data center from condensation due to exposure to outside air from an opened access door. The description of method 800 is provided with general reference to the specific components illustrated within the preceding FIGS. 1-6. In at least one embodiment, method 800 can be implemented using management controller 138 (FIG. 1) that operates environmental subsystem 144 (FIG. 1). With reference to FIG. 8A, method 800 includes monitoring sensor(s) that detect an outside temperature value and an outside humidity value of the outside air and an interior air temperature value of the data center (block 802). In one or more embodiments, method 800 includes mechanically cooling at least a portion of supply air circulated through the data center using a cooling system to cool at least one heat-generating information technology (IT) component (block 804). The mechanical cooling is controlled by (i) determining a cooling requirement based on an operating level of the at least one heat-generating IT component; and (ii) based on the cooling requirement, setting the temperature set point of the cooling system to a second temperature value that is sufficient to handle the cooling requirement. Mechanical cooling can create a situation where in the interior air temperature is less than a dew point of the outside air, which is addressed by the present disclosure. In one or more embodiments, an interior of the data center is colder than outside air that is due to outside weather instead of mechanical cooling. For example, the thermal mass within an insulated enclosure can lag behind outside thermal warming or humidity increases.

Method 800 includes monitoring sensor(s) that detect presence of a person proximate to an access door that exposes the heat-generating IT component(s) within the data center to outside air (block 806). A determination is made, in decision block 808, whether an external access request is identified to open an access door, based on presence of a person. In response to determining that the presence of a person is not detected, method 800 includes monitoring a maintenance schedule for the data center (block 810). A determination is made, in decision block 812, whether an external access request is identified to open the access door based on the maintenance schedule. In response to determining that the external access request is not identified to open the access door based on the maintenance schedule, method 800 proceeds to block 802.

With reference to FIG. 8B, in response to determining that an external access request is identified in either decision block 808 or 812, a determination is made in decision block 814 whether a dew point temperature of the outside air is greater than the interior air temperature. In one or more embodiments, temperatures of the supply air can vary along a cold aisle within the data center. In addition, sensors can be spaced such that variations are not wholly or accurately sensed. To avoid condensation, the dew point temperature can be determined approximately or determined conservatively. In one or more embodiments, method 800 includes determining whether the dew point temperature of the outside air is greater than the interior air temperature by adjusting downward an initial dew point temperature estimate by a first temperature offset, such as 2-4° C., to compensate for variability and inaccuracies-in temperature and humidity variability increasing the temperature set point of the cooling system to the first temperature value that increases the interior air temperature above the dew point temperature of the outside air in response to determining that the dew point temperature of the outside air is greater than the interior air temperature, increasing a temperature set point of the cooling system to first temperature value that increases the interior air temperature above the dew point temperature of the outside air. In response to determining that the dew point temperature of the outside air is not greater than the interior air temperature, method 800 includes presenting an indication, via the externally exposed user interface device proximate to the access door, that access to the interior of the MDC via the access door is approved (block 816). Method 800 includes unlocking the access door (block 818). Then method 800 proceeds to block 802 (FIG. 8A).

In response to determining in decision block 814 that the dew point temperature of the outside air is greater than the interior air temperature, method 800 includes determining a cooling requirement based on an operating level of the at least one heat-generating IT component (block 820). Method 800 includes determining a first temperature value that increases the interior air temperature above the dew point temperature of the outside air (block 822). A determination is made in decision block 824, whether the first temperature value meets the cooling requirement. In response to determining that the first temperature value does not meet the cooling requirement, method 800 includes determining a reduced cooling requirement that is met by the cooling system at the first temperature value (block 826).

Figure 8C:
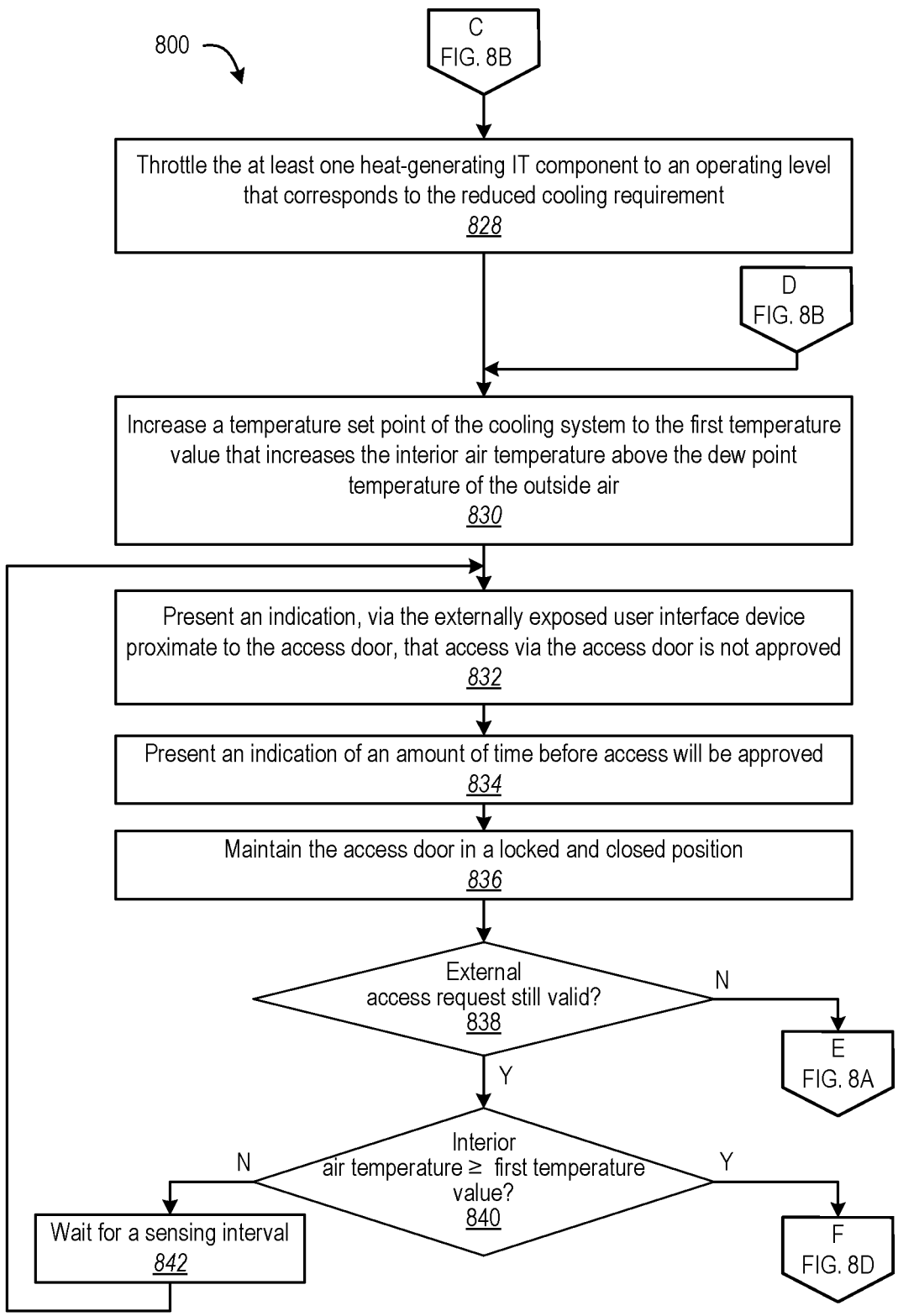

With reference to FIG. 8C, method 800 includes throttling the at least one heat-generating IT component to an operating level that corresponds to the reduced cooling requirement (block 828). In response to determining in decision block 824 (FIG. 8B) that the first temperature value meets the cooling requirement or after method 800 proceeds from block 828, method 800 includes increasing a temperature set point of the cooling system to the first temperature value that increases the interior air temperature above the dew point temperature of the outside air (block 830).

Changing the internal air temperature is not instantaneous. A period of time ensues wherein the internal air temperature continues to be colder than the dew point temperature of the outside air. To mitigate or avoid allowing outside air to enter the data center during this period of time, method 800 can perform one or more measures to prevent or dissuade premature opening of the access door. Method 800 includes presenting an indication, via the externally exposed user interface device proximate to the access door, that access via the access door is not approved (block 832). In one embodiment, method 800 includes presenting an indication of an amount of time before access will be approved (block 834). Method 800 includes maintaining the access door in a locked and closed position (block 836) until the time expires (e.g., the countdown timer reaches zero). A determination is made in decision block 838, whether the external access request is still valid. For example, method 800 can include determining that a scheduled maintenance period has expired or that no person is detected inside of the data center or proximate to the access door, making an external access request for either condition to no longer be valid. In response to determining that the external access request is not still valid, method 800 proceeds to block 802 (FIG. 8A). A determination is made, in decision block 840, whether the interior air temperature is equal to or greater than the first temperature value. In response to determining that the interior air temperature is less than the first temperature value, method 800 includes waiting for a sensing interval (block 842). Then method 800 proceeds to block 832.

Figure 8D:
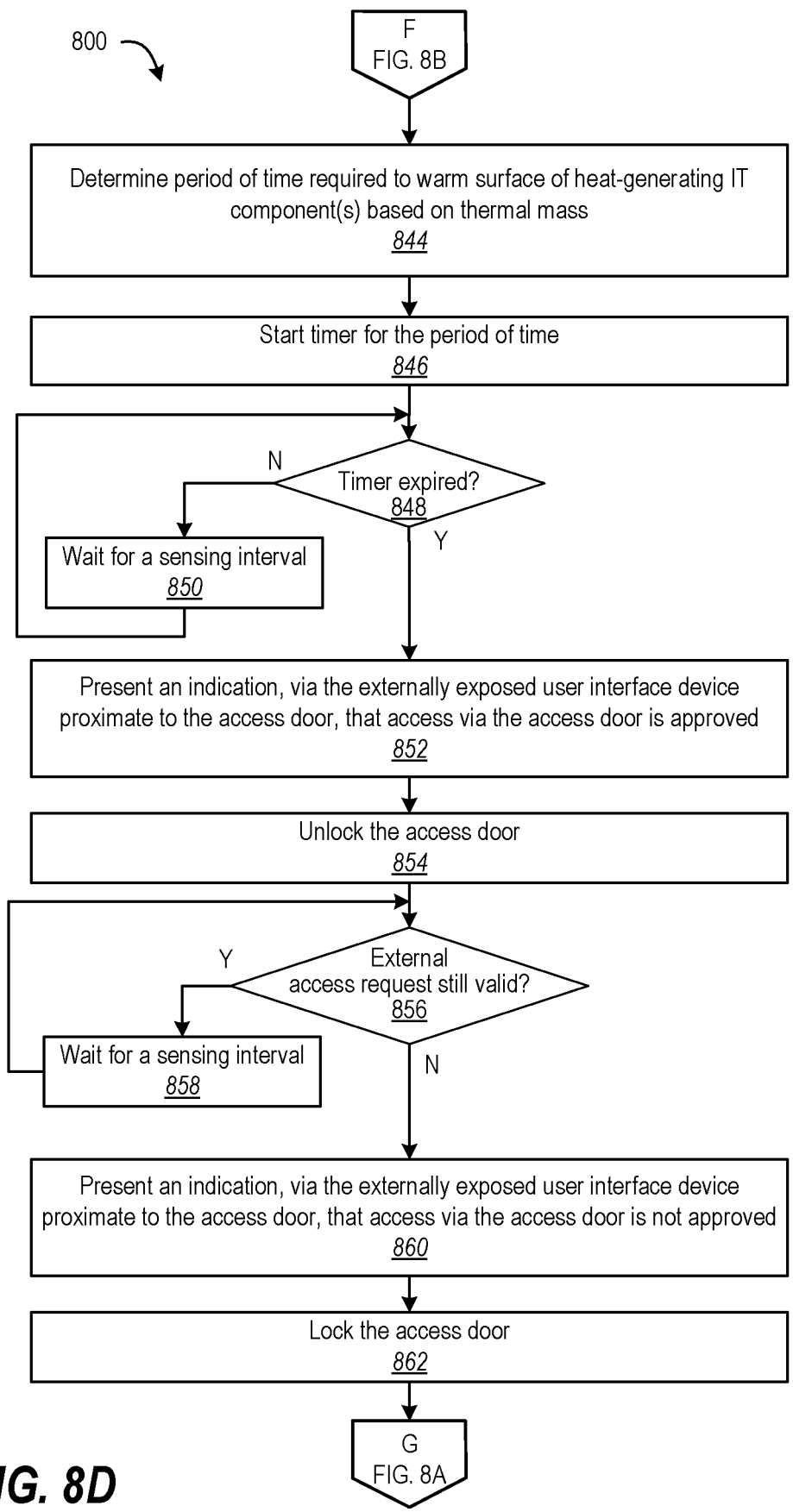

In response to the interior air temperature being equal to or greater than the first temperature value, with reference to FIG. 8D, method 800 includes determining a period of time required to warm the surface of heat-generating IT component(s) based on thermal mass (block 844). Method 800 includes starting a timer for the period of time (block 846). A determination is made, in decision block 848, whether the timer tracking the period of time has expired. In response to determining that the timer has not expired, method 800 includes waiting for a sensing interval (block 850). Then method 800 proceeds to block 848. In response to determining that the timer has expired, method 800 includes presenting an indication, via the externally exposed user interface device proximate to the access door, that access via the access door is approved (block 852). Method 800 includes unlocking the access door (block 854).

In one or more embodiments, when possible, method 800 automatically returns operation to a mode that is most appropriate with the access door closed. In one or more embodiments, withdrawal or invalidation of the external access request is manually triggered by a user via a user interface. In one or more embodiments, sensors can detect that a person is no longer present either inside the MDC or proximate to the access door. In one or more embodiments, ending of a scheduled maintenance period is detected. A determination is made in decision block 856, whether the external access request is still valid. In response to determining that the external access request is still valid, method 800 includes waiting for a sensing interval (block 858). Then method 800 proceeds to block 856. In response to determining that the external access request is not still valid, method 800 includes presenting an indication, via the externally exposed user interface device proximate to the access door, that access via the access door is not approved (block 860). Method 800 includes locking the access door (block 862). Then method proceeds to block 802 (FIG. 8A).

In one or more embodiments, method 800 includes directing, by the cooling system, a portion of a supply air from a cold aisle to a hot aisle of a volumetric container via an equipment panel. The equipment panel is externally attached to the volumetric container of the data center such as an MDC. The equipment panel contains the at least one heat-generating IT component and the access door. In response to determining that the dew point temperature of the outside air is greater than the interior air temperature of the equipment panel, method 800 includes increasing a temperature set point of the cooling system to increase the interior air temperature within the equipment panel above the dew point temperature of the outside air. Then an indication is given that access is approved, such as illuminating a green light on an equipment panel access door or by electrically unlocking the equipment panel access door.

Figure 9:
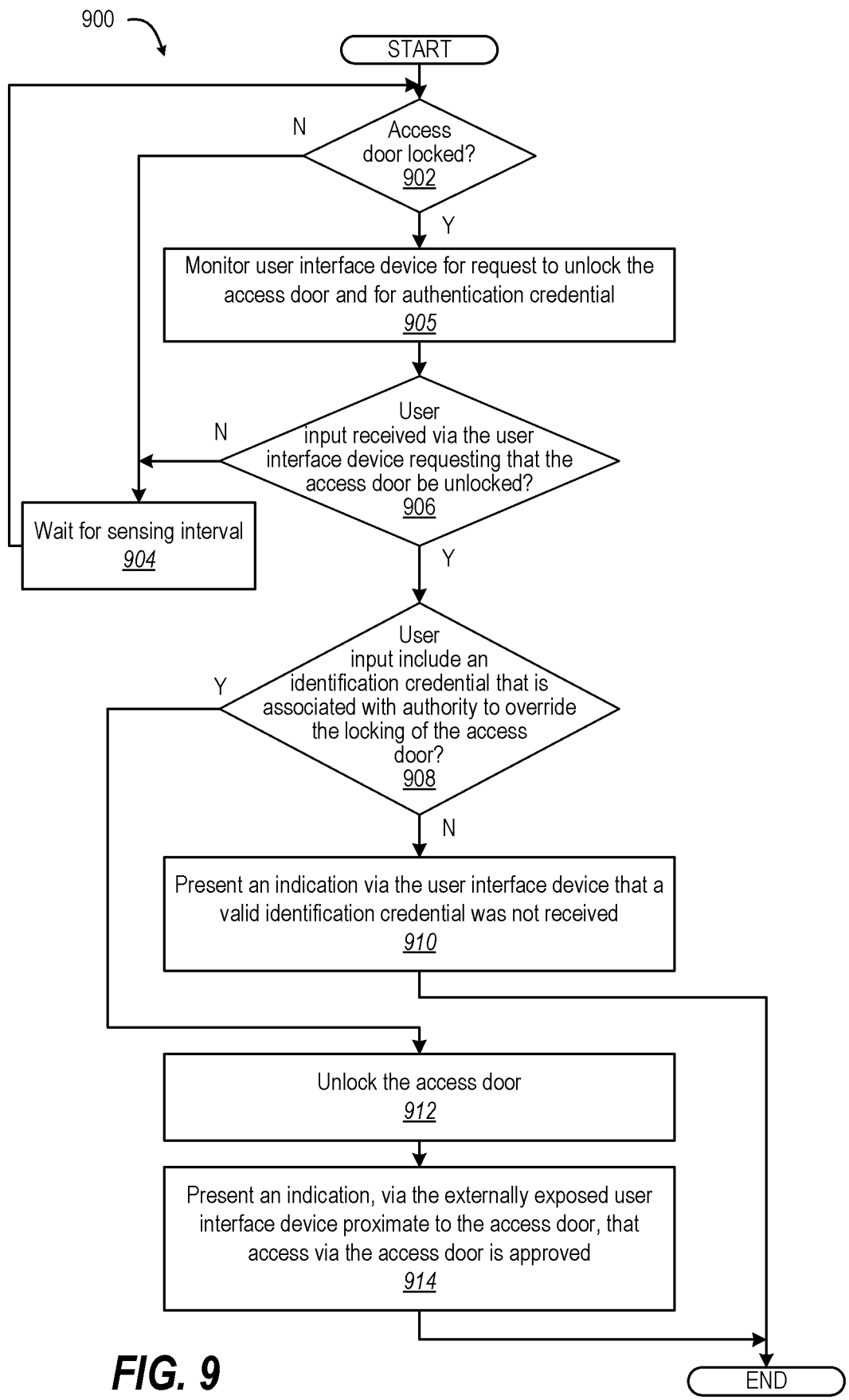
FIG. 9 depicts a flow chart illustrating an example method for facilitating user override of automatic locking of the data center, according to one or more embodiments.

FIG. 9 presents a flow diagram of method 900 for facilitating user override of automatic locking of the data center. In one or more embodiments, method 900 operates in parallel with method 800 (FIGS. 8A-8D). The description of method 900 is provided with general reference to the specific components illustrated within the preceding FIGS. 1-6. In at least one embodiment, method 900 can be implemented using management controller 138 (FIG. 1) that operates environmental subsystem 144 (FIG. 1). With reference now to the figure, a determination is made, in decision block 902, whether the access door is locked. In response to determining that the access door is not locked, method 900 includes waiting for a sensing interval (block 904). Then method 900 proceeds to block 902. In response to determining that the access door is locked, method 900 including monitoring a user interface device for a request to unlock the access door and for an identification credential (block 905). A determination is made, in decision block 906, whether a user input is received via the user interface device requesting that the access door be unlocked. In response to not receiving a user input via the user interface device requesting that the access door be unlocked, method 900 proceeds to block 904. In response to receiving a user input via the user interface device requesting that the access door be unlocked, a determination is made, in decision block 908, whether the user input includes an identification credential that is associated with someone having the authority to override the locking of the access door. The identification credential can be received by on one or more of: (i) reading a radio frequency identification (RFID) code on a user badge; (ii) reading a computer access card; (iii) receiving a user alphanumeric password; and (iv) performing biometric recognition (e.g., speech, face, fingerprint, retina, etc.). In response to receiving a user input that does not include an identification credential that provides the authority to override the locking of the access door, method 900 includes presenting an indication via the user interface device that a valid identification credential was not received (block 910). Then method 900 ends. In response to receiving a user input that includes an identification credential that provides the authority to override the locking of the access door, method 900 includes unlocking the access door (block 912). Method 900 includes presenting an indication, via the externally exposed user interface device proximate to the access door, that access via the access door is approved (block 914). Then method 900 ends.

Figure 10:
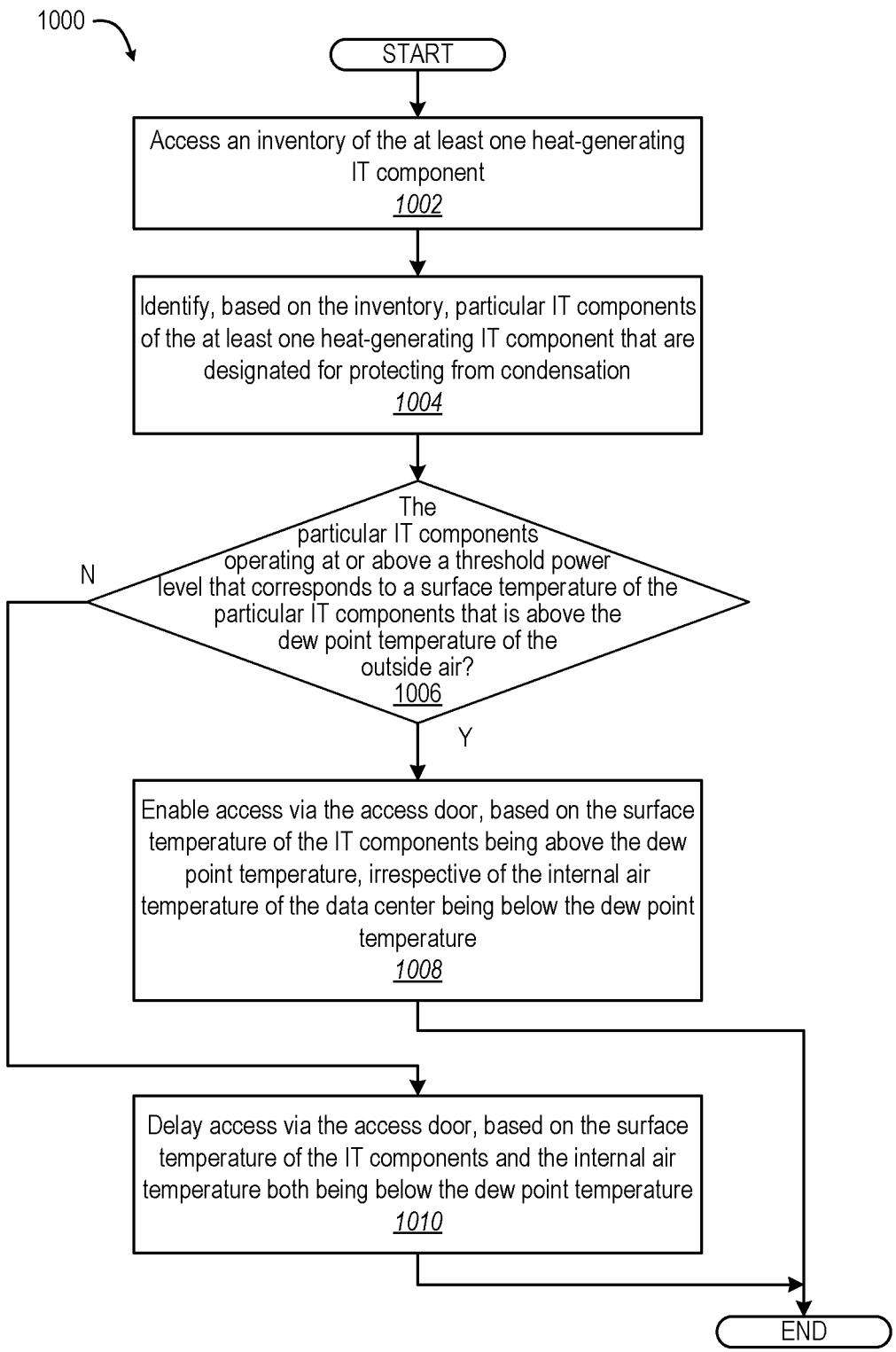
FIG. 10 depicts a flow chart illustrating an example method for automatically overriding of locking of an access door of a data center based on a surface temperature of IT component(s), according to one or more embodiments.

FIG. 10 presents a flow diagram of method 1000 for automatically overriding the locking of an access door of a data center, based on a surface temperature of IT component(s). In one or more embodiments, method 1000 operates in parallel with method 800 (FIGS. 8A-8D). The description of method 800 is provided with general reference to the specific components illustrated within the preceding FIGS. 1-6. In at least one embodiment, method 1000 can be implemented using management controller 138 (FIG. 1) that operates environmental subsystem 144 (FIG. 1). Method 1000 includes accessing an inventory of the at least one heat-generating IT component (block 1002). Method 1000 includes identifying, based on the inventory, particular IT components of the at least one heat-generating IT component that are designated for protecting from condensation (block 1004). Method 1000 includes determining, in decision block 1006, whether the particular IT components are operating at or above a threshold power level that corresponds to a surface temperature of the particular IT components that is above the dew point temperature of the outside air. In response to determining that the particular IT components are operating at or above the threshold power level, method 1000 includes enabling access via the access door, based on the surface temperature of the IT components being above the dew point temperature, irrespective of the internal air temperature of the data center being below the dew point temperature (block 1008). Then method 1000 ends. In response to determining that the particular IT components are not operating at or above the threshold power level, method 1000 includes delaying access via the access door, based on the surface temperature of the IT components and the internal air temperature both being below the dew point temperature (block 1010). Then method 1000 ends.

In the above described flow charts, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method of protecting internal components of a data center from condensation due to exposure to outside air, the method comprising:

monitoring a plurality of sensors that detect an outside temperature value and an outside humidity value of the outside air and an interior air temperature value of the data center;

identifying an external access request to open an access door that exposes at least one heat-generating information technology (IT) component within the data center to outside air;

based on the outside and the interior air temperature values and the outside humidity value received from the plurality of sensors, determining whether a dew point temperature of the outside air is greater than the interior air temperature; and in response to determining that the dew point temperature of the outside air is greater than the interior air temperature, increasing a temperature set point of the cooling system to a first temperature value that increases the interior air temperature above the dew point temperature of the outside air.

2. The method of claim 1, further comprising:

mechanically cooling at least a portion of supply air circulated through the data center using a cooling system to cool at least one heat-generating information technology (IT) component by:

determining a cooling requirement based on an operating level of the at least one heat-generating IT component; and based on the cooling requirement, setting the temperature set point to a second temperature value of the cooling system that is sufficient to handle the cooling requirement; and in response to identifying the external access request, increasing the temperature set point of the cooling system to the first temperature value that increases the interior air temperature above the dew point temperature of the outside air and at least meets the cooling requirement based on the operating level of the at least one heat-generating IT component.

3. The method of claim 2, wherein increasing the temperature set point of the cooling system to the first temperature value that increases the interior air temperature above the dew point temperature of the outside air and at least meets the cooling requirement based on the operating level of the at least one heat-generating IT component further comprises:

determining whether the first temperature value meets the cooling requirement of the at least one heat-generating IT component at a current operating level;

in response to determining that the first temperature value meets the cooling requirement, increasing the temperature set point to the first temperature value without throttling the at least one heat-generating IT component to an operating level that is less than the current operating level; and in response to determining that the first temperature value does not meet the cooling requirement:

determining a reduced cooling requirement that is met by the cooling system at the first temperature value;

throttling the at least one heat-generating IT component to an operating level that corresponds to the reduced cooling requirement; and increasing the temperature set point of the cooling system to the first temperature value.

4. The method of claim 2, wherein:

identifying the external access request to open the access door comprises accessing a scheduled maintenance period for the data center; and the method further comprises:
  determining whether the scheduled maintenance period has ended; and
  resetting the temperature set point to the second temperature value in response to determining that the scheduled maintenance period has ended.

5. The method of claim 2, wherein:
identifying the external access request to open the access door comprises detecting, a person proximate to the access panel; and
the method further comprises:
  determining whether the person has left the data center based on the access door being closed and no person being detected inside of the data center or proximate to the access door; and
  resetting the temperature set point to the second temperature value in response to determining that the person has left the data center.

6. The method of claim 1, further comprising:
directing, by the cooling system, a portion of a supply air from a cold aisle to a hot aisle of a volumetric container via an equipment panel externally attached to the volumetric container of the data center comprising a modular data center (MDC), the equipment panel containing the at least one heat-generating IT component and comprising the access door; and
in response to determining that the dew point temperature of the outside air is greater than the interior air temperature of the equipment panel, increasing a temperature set point of the cooling system to increase the interior air temperature within the equipment panel above the dew point temperature of the outside air.

7. The method of claim 1, further comprising:
in response to determining that the dew point temperature of the outside air is greater than the interior air temperature, presenting an indication, via an externally exposed user interface device proximate to the access door, that access via the access door is not approved; and
in response to determining that the dew point temperature of the outside air is not greater than the interior air temperature, presenting an indication, via the externally exposed user interface device proximate to the access door, that access via the access door is approved.

8. The method of claim 1, further comprising, in response to determining that the dew point temperature of the outside air is greater than the interior air temperature, maintaining the access door in a locked and closed position.

9. The method of claim 8, further comprising:
in response to determining that the dew point temperature of the outside air is greater than the interior air temperature, presenting an indication, via an externally exposed user interface device proximate to the access door, that access via the access door is not approved; and
in response to receiving a user input via the user interface device requesting that the access door be unlocked:
  determining whether the user input comprises an identification credential that is associated with authority to override the locking of the access door; and
  unlocking the access door in response to determining that the identification credential is associated with the authority to override the locking of the door.

10. The method of claim 1, further comprising:
determining whether the interior temperature has reached the temperature set point at which the interior air temperature is above the dew point temperature of the outside air; and
in response to determining that the interior temperature has reached the temperature set point:
  holding the interior temperature at the temperature set point for a period of time required by a thermal mass of the at least one heat-generating IT component to have a surface temperature that is above the dew point temperature of the outside air; and
  presenting an indication, via the externally exposed user interface device proximate to the access door, that access via the access door is approved in response determining that the period of time has elapsed.

11. The method of claim 1, further comprising:
accessing an inventory of the at least one heat-generating IT component;
identifying, based on the inventory, particular IT components of the at least one heat-generating IT component that are designated for protecting from condensation;
determining whether the particular IT components are operating at or above a threshold power level that corresponds to a surface temperature of the particular IT components that is above the dew point temperature of the outside air;
in response to determining that the particular IT components are operating at or above the threshold power level, enabling access via the access door, based on the surface temperature of the IT components being above the dew point temperature, irrespective of the internal air temperature of the data center being below the dew point temperature; and
in response to determining that the particular IT components are not operating at or above the threshold power level, delaying access via the access door, based on the surface temperature of the IT components and the internal air temperature both being below the dew point temperature.

12. The method of claim 1, wherein:
determining whether the dew point temperature of the outside air is greater than the interior air temperature comprises adjusting upward an initial dew point temperature estimate by a first temperature offset; and
the method further comprises increasing the temperature set point of the cooling system to the first temperature value that increases the interior air temperature above the dew point temperature of the outside air by a second temperature offset, the first and second temperature offsets mitigating occurrence of condensation within the data center attributable to variations in sensed and actual temperature and humidity inside and outside of the data center.

13. An environmental system of a data center, the environmental system comprising:
  one or more cooling and heating units that circulate air through a data center;
  a plurality of sensors that detect an outside temperature value and an outside humidity value of the outside air and an interior temperature value of the data center;
  a memory containing a cooling mode and external access control (CM/EAC) application; and
  a controller that is communicatively coupled to the one or more cooling and heating units, the one or more sensors, and the memory, the controller executing the CM/EAC application to enable the data center cooling system to:
  monitor the plurality of sensors that detect an outside temperature value and an outside humidity value of the outside air and an interior air temperature value of the data center;
  identify an external access request to open an access door that exposes at least one heat-generating information technology (IT) component within the data center to outside air;
  based on the outside and the interior air temperature values and the outside humidity value received from the plurality of sensors, determine whether a dew point temperature of the outside air is greater than the interior air temperature; and
  in response to determining that the dew point temperature of the outside air is greater than the interior air temperature, increase a temperature set point of the cooling system to a first temperature value that increases the interior air temperature above the dew point temperature of the outside air.

14. The environmental system of claim 13, wherein the controller executes the CM/EAC application to enable the data center cooling system to mechanically cool at least a portion of supply air circulated through the data center using a cooling system to cool at least one heat-generating information technology (IT) component, wherein the controller executes the CM/EAC application to enable the data center cooling system to:
  determine a cooling requirement based on an operating level of the at least one heat-generating IT component at a current operating level;
  determine whether the first temperature value meets the cooling requirement of the at least one heat-generating IT component at the current operating level;
  in response to determining that the first temperature value meets the cooling requirement, increase the temperature set point to the first temperature value without throttling the at least one heat-generating IT component to an operating level that is less than the current operating level; and
  in response to determining that the first temperature value does not meet the cooling requirement:
    determine a reduced cooling requirement that is met by the cooling system at the first temperature value;
    throttle the at least one heat-generating IT component to an operating level that corresponds to the reduced cooling requirement; and
    increase the temperature set point of the cooling system to the first temperature value.

15. The environmental system of claim 14, wherein the controller executes the CM/EAC application to:
  identify the external access request to open the access door by accessing a scheduled maintenance period for the data center;
  determine whether the scheduled maintenance period has ended; and
  reset the temperature set point to the second temperature value in response to determining that the scheduled maintenance period has ended.

16. The environmental system of claim 14, wherein the controller executes the CM/EAC application to:
  identify the external access request to open the access door by detecting a person proximate to the access panel;
  determine whether the person has left the data center based on the access door being closed and no person being detected inside of the data center or proximate to the access door; and
  reset the temperature set point to the second temperature value in response to determining that the person has left the data center.

17. The environmental system of claim 13, further comprising an equipment panel externally attached to the volumetric container of the data center comprising a modular data center (MDC), the equipment panel containing the at least one heat-generating IT component and comprising the access door, wherein the controller executes the CM/EAC application to:
  direct, by the one or more cooling and heating units, a portion of a supply air from a cold aisle to a hot aisle of a volumetric container via the equipment panel; and
  in response to determining that the dew point temperature of the outside air is greater than the interior air temperature of the equipment panel, increase a temperature set point of the cooling system to increase the interior air temperature within the equipment panel above the dew point temperature of the outside air.

18. The environmental system of claim 13, wherein the controller executes the CM/EAC application to:
  in response to determining that the dew point temperature of the outside air is not greater than the interior air temperature, present an indication, via the externally exposed user interface device proximate to the access door, that access via the access door is approved; and
  in response to determining that the dew point temperature of the outside air is greater than the interior air temperature:
    present an indication, via an externally exposed user interface device proximate to the access door, that access via the access door is not approved;
    maintain the access door in a locked and closed position; and
    in response to receiving a user input via the user interface device requesting that the access door be unlocked:
      determine whether the user input comprises an identification credential that is associated with authority to override the locking of the access door; and
      unlock the access door in response to determining that the identification credential is associated with the authority to override the locking of the door.

19. The environmental system of claim 13, wherein the controller executes the CM/EAC application to:
  determine whether the interior temperature has reached the temperature set point at which the interior air temperature is above the dew point temperature of the outside air; and
  in response to determining that the interior temperature has reached the temperature set point:
    hold the interior temperature at the temperature set point for a period of time required by a thermal mass of the at least one heat-generating IT component to have a surface temperature that is above the dew point temperature of the outside air; and
    present an indication, via the externally exposed user interface device proximate to the access door, that access via the access door is approved in response determining that the period of time has elapsed.

20. A data center comprising:
a volumetric container;
at least one heat-generating information technology (IT) component positioned in the volumetric container; and
an environmental system comprising:
- one or more cooling and heating units that circulates air through the data center;
- a plurality of sensors that detect an outside temperature value and an outside humidity value of the outside air and an interior temperature value of the data center;
- a memory containing a cooling mode and external access control (CM/EAC) application; and
- a controller that is communicatively coupled to the one or more cooling and heating units, the one or more sensors, and the memory, the controller executing the CM/EAC application to enable the data center cooling system to:
  - monitor the plurality of sensors that detect an outside temperature value and an outside humidity value of the outside air and an interior air temperature value of the data center;
  - identify an external access request to open an access door that exposes at least one heat-generating IT component within the data center to outside air;
  - based on the outside and the interior air temperature values and the outside humidity value received from the plurality of sensors, determine whether a dew point temperature of the outside air is greater than the interior air temperature; and
  - in response to determining that the dew point temperature of the outside air is greater than the interior air temperature, increase a temperature set point of the cooling system to a first temperature value that increases the interior air temperature above the dew point temperature of the outside air.

* * * * *